(12) United States Patent
Engeter et al.

(10) Patent No.: US 12,398,859 B2
(45) Date of Patent: Aug. 26, 2025

(54) LIGHT-EMITTING COMPONENT WITH COVER

(71) Applicant: OSRAM Opto Semiconductors GmbH, Regensburg (DE)

(72) Inventors: Konstantin Engeter, Regensburg (DE); Alexander Günther, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 496 days.

(21) Appl. No.: 17/793,493

(22) PCT Filed: Jan. 15, 2021

(86) PCT No.: PCT/EP2021/050769
§ 371 (c)(1),
(2) Date: Jul. 18, 2022

(87) PCT Pub. No.: WO2021/144402
PCT Pub. Date: Jul. 22, 2021

(65) Prior Publication Data
US 2023/0073536 A1  Mar. 9, 2023

(30) Foreign Application Priority Data
Jan. 17, 2020 (DE) ..................... 10 2020 101 038.9

(51) Int. Cl.
*H01L 33/60* (2010.01)
*F21V 7/28* (2018.01)
(Continued)

(52) U.S. Cl.
CPC ............. *F21V 7/28* (2018.02); *H10H 20/855* (2025.01); *F21S 41/153* (2018.01); *F21Y 2115/10* (2016.08); *H01L 25/0753* (2013.01)

(58) Field of Classification Search
CPC ........ H01L 33/58; H01L 33/486; F21S 43/14; F21S 43/00
See application file for complete search history.

(56) References Cited

U.S. PATENT DOCUMENTS 6,014,202 A * 1/2000 Chapnik ................. B41J 2/451
355/55
2012/0235169 A1  9/2012 Seko et al.
(Continued)

FOREIGN PATENT DOCUMENTS

DE  10 2011 113 483 A1  3/2013
DE  10 2012 109 183 A1  3/2014
(Continued)

OTHER PUBLICATIONS

International Search Report issued for corresponding International Patent Application No. PCT/EP2021/050769 on Apr. 1, 2021, along with an English translation.
(Continued)

*Primary Examiner* — Tracie Y Green
(74) *Attorney, Agent, or Firm* — Hauptman Ham, LLP

(57) ABSTRACT

A light-emitting component includes a connection board with a mounting side. The light-emitting component also includes a light source. The light source is fastened and electrically connected to the connection board on the mounting side. The light-emitting component further includes a cover which covers the connection board in places on its mounting side and laterally surrounds the light source. The light-emitting component additionally includes an optical element. The optical element has a central region which is arranged downstream of the light source on the mounting side of the connection board. A provision is made to prevent impingement of light in the central region of the optical element.

11 Claims, 3 Drawing Sheets

Figure 1:
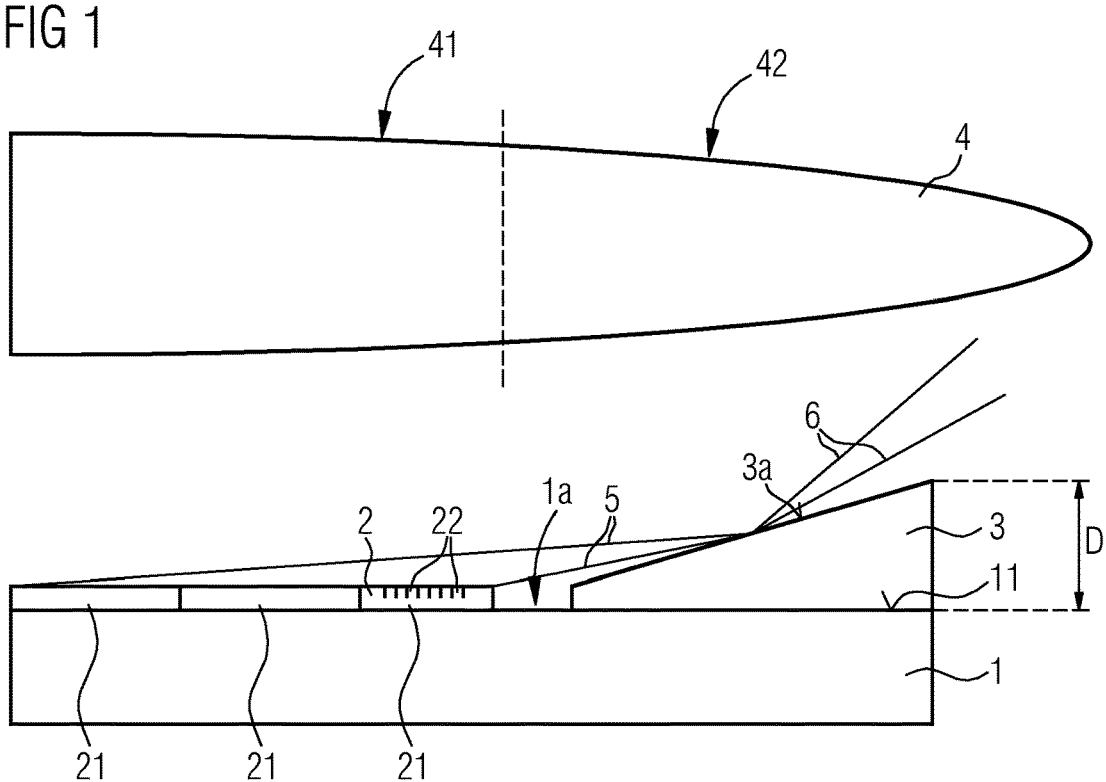

(51) Int. Cl.
  *H10H 20/855* (2025.01)
  *F21S 41/153* (2018.01)
  *F21Y 115/10* (2016.01)
  *H01L 25/075* (2006.01)

(56) References Cited

U.S. PATENT DOCUMENTS

| | | | |
|---|---|---|---|
| 2013/0121000 A1* | 5/2013 | Lee | H01L 33/56 |
| | | | 362/293 |
| 2014/0225147 A1 | 8/2014 | Halbritter et al. | |
| 2015/0226839 A1 | 8/2015 | Brandl et al. | |
| 2016/0079507 A1* | 3/2016 | Lee | H01L 33/58 |
| | | | 257/98 |
| 2017/0062678 A1 | 3/2017 | Butterworth | |

FOREIGN PATENT DOCUMENTS

| | | |
|---|---|---|
| EP | 2 595 205 A2 | 5/2013 |
| JP | S58-140901 A | 8/1983 |
| JP | H10-125115 A | 5/1998 |
| JP | 2003-517383 A | 5/2003 |
| JP | 2012-503335 A | 2/2012 |
| JP | 2013-106047 A | 5/2013 |
| JP | 2014-175126 A | 9/2014 |
| JP | 2015-149307 A | 8/2015 |
| JP | 2017-510061 A | 4/2017 |
| WO | 99/14937 A1 | 3/1999 |
| WO | 2019/158319 A1 | 8/2019 |

OTHER PUBLICATIONS

Written Opinion issued for corresponding International Patent Application No. PCT/EP2021/050769 on Apr. 1, 2021.

* cited by examiner

LIGHT-EMITTING COMPONENT WITH COVER

CROSS REFERENCE TO RELATED APPLICATION

This application is a National Stage of International Application No. PCT/EP2021/050769, filed on Jan. 15, 2021, which designates the United States and was published in Europe, and which claims priority to German Patent Application No. 10 2020 101 038.9, filed on Jan. 17, 2020, in the German Patent Office. Both of the aforementioned applications are hereby incorporated by reference in their entireties.

A light-emitting component is provided. The light-emitting component can be used, for example, in a motor vehicle headlight or in a projection device. The light-emitting component is configured to emit light in a wavelength range between infrared radiation and UV-radiation in operation. For example, the light-emitting component is configured to emit white light during operation.

A task to be solved is to provide a light-emitting component which emits light of particularly high quality.

According to at least one embodiment of the light-emitting component, the light-emitting component comprises a connection board. The connection board is, for example, a circuit board with contact points for contacting electrical components of the light-emitting component. The connection board may be, for example, a metal core board, a ceramic carrier with metallic contact points or a printed circuit board. On one mounting side, the connection board comprises a mounting surface on which electrical components of the light-emitting component are applied. In addition to the electrical properties of the connection board for contacting the electrical components of the component, the connection board also comprises, in particular, a mechanical supporting function in the light-emitting component. That is, at least some parts of the light-emitting component are mechanically supported and carried by the connection board.

According to at least one embodiment, the light-emitting component comprises a light source. The light source is configured to generate electromagnetic radiation, in particular the light emitted by the light-emitting component in operation. The light-emitting component may comprise one or more light sources, which may be designed identically or differently to each other.

For this purpose, the light source comprises, for example, one or more light-emitting diode chips. The light-emitting diode chips may be pixelated light-emitting diode chips, for example. A pixelated light-emitting diode chip comprises two or more emission regions that are separately controllable. For example, the emission regions of the pixelated light-emitting diode chip are arranged at the grid points of a regular grid.

The one or more light-emitting diode chips of the light source include, for example, an active region in which primary radiation in the wavelength range of UV-radiation and/or blue light is generated in operation. Downstream of the active region may be a conversion element that converts a portion of the primary radiation into secondary radiation of a lower-energy wavelength range so that mixed light, for example white mixed light, is emitted overall.

The light source of the light-emitting component is fastened and electrically connected to the connection board at the mounting side. For example, the light source is attached to the mounting surface of the connection board by means of a solder or an adhesive.

According to at least one embodiment of the light-emitting component, the light-emitting component comprises a cover that covers the connection board in places on its mounting side and laterally surrounds the light source. The cover can, for example, completely surround the light source laterally, without covering the light source in a vertical direction. The lateral directions run, for example, parallel to a main extension direction of the connection board and/or parallel to the mounting surface of the connection board. The vertical direction is perpendicular to the lateral directions.

For this purpose, the cover can be in direct contact with the mounting surface of the connection board. For example, the cover covers connection elements, for example wires, with which electrical components of the light-emitting component are electrically conductively connected to the connection board. For example, the cover covers wires with which the light source is electrically conductively connected to the connection board. The cover can surround the light source, in particular ring-shaped or frame-shaped. The cover is, for example, a glob top.

According to at least one embodiment of the light-emitting component, the light-emitting component comprises an optical element with a central region arranged downstream of the light source on the mounting side of the connection board. In other words, the light source is arranged between the connection board and the optical element. The optical element comprises a central region which may be laterally surrounded by an edge region of the optical element. Light entering the optical element in the central region is specifically optically influenced by the optical element. Light entering in the edge region may be influenced in an undesirable manner, such that radiation entering in the edge region or from the edge region into the central region of the optical element is undesirable.

The optical element may be, for example, an optical lens, a Fresnel lens, a reflector, a transparent plate, or an optical concentrator. The optical element is designed, for example, to map light emitted by the light source in operation into the far field, that is, for example, to project the luminance distribution of the light source into the far field. The optical element is formed with a transparent material such as glass or a plastic.

According to at least one embodiment of the light-emitting component, at least one provision is made to prevent impingement of light in the central region of the optical element. The light may in particular be reflected light. In other words, provisions are then made to ensure that only light emitted directly by the light source enters the central region of the optical element. Light that is reflected at least once at another part of the component, for example at the connection board, is prevented from impinging in the central region by the provision. Further, it is possible that due to the provision the reflected light is prevented from entering within an acceptance angle of a subsequent optical system.

Additionally or alternatively, it is possible that the light is also partially non-reflected light that is prevented from entering the central region.

According to at least one embodiment, a light-emitting component is disclosed comprising
  a connection board with a mounting side,
  a light source which is fastened and electrically connected to the connection board on the mounting side a cover which covers the connection board in places on its mounting side and laterally surrounds the light source an optical element having a central region which is arranged downstream of the light source on the mounting side of the connection board, wherein a provision is made to prevent impingement of light in the central region of the optical element.

The light-emitting component described herein is based on the following considerations, among others. When the light-emitting component is used, for example in the headlamp of a motor vehicle or in a projection device, the luminance distribution of the light sources is to be mapped directly into the far field. Thereby, the problem can arise that in the edge region of the luminous field undesired sharp lines or washed-out areas are mapped into the far field. These undesired mappings into the far field are caused, for example, by light being reflected at other parts of the component reaching the central area of the optical element and thus being mapped into the far field. For example, reflections can occur at the cover and/or at the connection board, which are undesirably mapped into the far field.

The light-emitting component described herein is now based on the findings that preventing an impingement of reflected light and/or of a portion of non-reflected light in the central region of the optical element results in that the luminance of the light source projected into the far field can take place without disturbing artifacts.

According to at least one embodiment of the light-emitting component, the cover is configured to guide light emitted by the light source away from the central region of the optical element. That means, in this embodiment, the cover is designed, for example with respect to its shape, with respect to its optical properties and/or with respect to its material, in such a way that a provision is made which prevents impingement of, for example, reflected light in the central region of the optical element. In particular, it is possible that the provision causes a guiding of the light away from the acceptance angle of a subsequent optical system.

For example, the cover may comprise a thickness for this purpose that increases in a direction away from the light source, at least initially. In this way, the cover may comprise an outer surface on its side facing away from the connection board, which reflects light emerging from the light source away from the central region of the optical element.

The outer surface runs, for example, at least in places obliquely to the mounting surface on the mounting side of the connection board. For example, the outer surface forms an acute angle with the mounting surface of the connection board. Thus, the cover may be designed wedge-shaped in cross-section, for example. In this way, light emitted by the light source is not directed in the direction of the central region of the optical element, which in particular is arranged directly above the light source, but towards the edge region of the optical element, which may be arranged above the cover, or laterally out of the optical component.

For this purpose, it is particularly possible for the cover to comprise a reflective outer surface on its side facing away from the connection board, which reflects impinging light in a directional manner. This can be achieved, for example, by the cover being formed with a reflective material and/or comprising a smooth surface on its side facing away from the mounting side.

According to at least one embodiment of the light-emitting component, the cover comprises a light-reflecting layer on its outer surface. In this embodiment, the outer surface of the cover does not have to be configured to be reflective, but rather a further layer is applied to the cover that is configured to reflect impinging light as directionally as possible. For example, the light-reflecting layer is formed by a layer sequence of layers with different refractive index, each of which is formed from electrically insulating materials such as metal oxides and/or metal nitrides and/or semiconductor oxides and/or semiconductor nitrides. For example, the reflective layer may comprise alternating sublayers formed with silicon oxide and silicon nitride. Alternatively, it is possible, that the light-reflecting layer is a metallic layer comprising, for example, silver and/or aluminum, or formed from either of these materials.

According to at least one embodiment of the light-emitting component, an optical body, which guides light emitted by the light source away from the central region of the optical element is arranged between the light source and the cover. The optical body may be a reflector, for example. The reflector may be directly adjacent to the cover on the side of the cover facing the light source, or a gap may be arranged between the cover and the optical body.

For example, the optical body is formed with a directionally reflective material or its outer surface is coated with the directionally reflective material. The optical body may be designed wedge-shaped in cross-section, for example, with the wedge tapering towards the light source. The optical body then comprises an outer surface that runs obliquely to the mounting surface of the connection board.

Further, it is possible, that the optical body is a light guide element that directs light entering the optical body away from the central region of the optical element. In this case, the optical body may, for example, comprise a light guide or be a light guide. It is further possible that the optical body is a refractive element, such as a prism, which refracts impinging light away from the central region of the optical element.

According to at least one embodiment of the light-emitting component, the optical element comprises, in the edge region that laterally surrounds the central region, a light-absorbing layer on the side of the optical element facing the connection board. The light-absorbing layer is configured to absorb light. In other words, in this embodiment, the central region of the optical element on the side of the optical element facing the mounting carrier is surrounded by an absorbing layer that absorbs appearing light. As a result, light entering the edge region cannot enter the central region of the optical element. This way, a provision is made which prevents impingement of, for example, reflected light in the central region of the optical element. The light-absorbing layer consists, for example, of a light-absorbing material which absorbs at least 90% of the impinging visible light. The light-absorbing layer can then advantageously also absorb non-reflected light and in this way prevent it from entering the central region. Possible materials for forming the light-absorbing layer include, for example, organic optical rim coatings or inorganic coatings.

According to at least one embodiment of the light-emitting component, the optical element is covered in the edge region on the side of the optical element facing the connection board with a light-reflecting layer which is arranged to reflect, for example, reflected light. In this way, light entering the optical element in the edge region cannot reach the central region of the optical element, such that a provision is made to prevent impingement of, for example, reflected light in the central region of the optical element. For example, the light-reflecting layer is formed with a material that reflects at least 85% of the impinging visible light. The light-reflecting layer can then advantageously also reflect non-reflected light and in this way prevent it from entering the central region. The material may be, for example, silver or aluminum coatings and/or dielectric coatings.

According to at least one embodiment of the light-emitting component, an aperture, covering the light source and the cover is arranged between the light source and the optical element. By means of the aperture, a provision is made to prevent impingement of light in the central region of the optical element. For this purpose, the aperture comprises, in particular in the region of the central region of the optical element, so, for example, directly below the central region of the optical element, an optical opening through which light from the light source can pass. This opening is then, for example, arranged directly above the light source. Immediately above the cover, the aperture comprises an opaque region that prevents light reflected from the cover and/or some of the non-reflected light from entering. In this way, the light cannot reach the central region of the optical element.

According to at least one embodiment, the aperture comprises a main body and an opaque layer, wherein the opaque layer covers the main body in the region above the cover, at least in places, and the main body is free of the opaque layer in the region above the light source. The main body is formed, for example, with a light-transmitting material such as a plastic or a glass. The main body may comprise in a region in which it is free of the opaque layer, for example, an anti-reflective layer on its side facing the light source and/or on its side facing away from the light source, which suppresses reflections at the main body. In the region above the cover, the aperture is designed to be opaque to the light from the light source due to the opaque layer at the main body.

According to at least one embodiment of the light-emitting component, the cover projects beyond the light source on the mounting side. This means, for example, that the cover is designed thicker than the light source. In a vertical direction, for example perpendicular to the mounting surface, the cover projects beyond the light source. In this way, the cover can mechanically protect the light source from damage. However, due to this design, more light may impinge on the cover than would be the case if the light source projects beyond the cover. The provisions described herein, which prevent impingement of light in the central region of the optical element, therefore prove to be particularly advantageous.

In the light-emitting component described herein, it is particularly possible that two or more of the provisions described herein for preventing impingement of light in the central region are to be combined in one light-emitting component. For example, the cover may be arranged to direct light emitted by the light source away from the central region of the optical element, and an aperture may be arranged between the light source and the optical element to further prevent impingement of light in the central region.

A light-emitting component described herein is in particular characterized in that by avoiding mapping of unwanted reflections into the far field, the contrast of the luminance projected into the far field is increased. In this way, the projected light comprises a particularly high light quality.

In the following, the light-emitting component described herein will be explained in more detail with reference to examples and the corresponding figures.

FIGS. 1, 2, 3, 4, 5, 6 show exemplary embodiments of light-emitting components described herein by means of schematic sectional views.

Identical, similar or identically acting elements are provided with the same reference signs in the figures. The figures and the proportions of the elements shown in the figures are not to be regarded as true to scale. Rather, individual elements may be represented exaggeratedly large for better representability and/or for better comprehensibility.

The schematic sectional view of FIG. 1 and all of the following sectional views each show a section of the light-emitting component. The right half of the light-emitting component is shown here. The left half of the light-emitting component is designed, for example, axially symmetrical thereto, wherein the axis of symmetry is perpendicular to the connection board 1 and running along the left edge of the figure.

FIG. 1 shows a schematic sectional view of a light-emitting component described herein according to a first exemplary embodiment. The light-emitting component comprises a connection board 1 with a mounting side 1a. The connection board 1 is, for example, a circuit board. The light-emitting component further comprises a light source 2. Here, the light source 2 comprises multiple light-emitting diode chips 21. The light-emitting diode chips 21 are, for example, each pixelated light-emitting diode chips comprising pixels 22 which are separately controllable.

The light source is mechanically fastened and electrically connected to the mounting surface 11 on the mounting side 1a of the connection board 1. For example, the light source may be electrically conductively connected to the connection board 1 by contact wires that are not shown.

The light-emitting component further comprises a cover 3, which covers the connection board 2 at its mounting side 1a in places and laterally surrounds the light source. For example, the cover 3 completely surrounds the light source 2 in lateral directions that run parallel to the main extension plane of the connection board 1. In this case, the cover 3 projects beyond the light source 2 in the vertical direction that runs perpendicular to the main extension plane of the connection board 1. The cover 3 is, for example, formed with a plastic material. In particular, the cover 3 can be designed to be black or colored. For example, the cover 3 covers the contact wires with which the light source is electrically conductively connected to the connection board 1. The cover 3 acts as a mechanical protection for the light source as well as for further components such as the contact wires, for example.

The light-emitting component further comprises an optical element 4. The optical element 4 comprises a central region 41, which is arranged downstream of the light source 2 on the mounting side 1a of the connection board. Furthermore, the optical element 4 comprises an edge region 42 which completely surrounds the central region 41 in lateral direction. The edge region 42 is arranged above the cover 3, for example.

Further, the light-emitting component comprises a provision which prevents impingement of reflected light 6 in the central region 41 of the optical element 4.

In operation, the light source 2 emits light 5. The light 5 partially impinges on another part of the light-emitting component, in the present case for example on the cover 3, and is reflected there. In the present case, the shape of the cover 3 is selected such that the cover 3 is configured to guide light 5 emitted by the light source 2 away from the central region 41 of the optical element or to reflect the emitted light such that it no longer falls within the acceptance angle of the optical system. Thus, a provision is made to prevent impingement of the reflected light 6 in the central region of the optical element 4.

In the exemplary embodiment of FIG. 1, this is achieved by the cover comprising a thickness D which increases in a direction away from the light source 2. Furthermore, the cover 3 comprises a reflective outer surface 3a on its side facing away from the connection board 1, which reflects impinging light in a directional manner. Due to the increasing thickness, the outer surface 3a runs obliquely to the mounting surface 11 on the mounting surface 1a of the connection board 1. As a result, the reflected light 6 is guided away from the central region 41.

Figure 2:
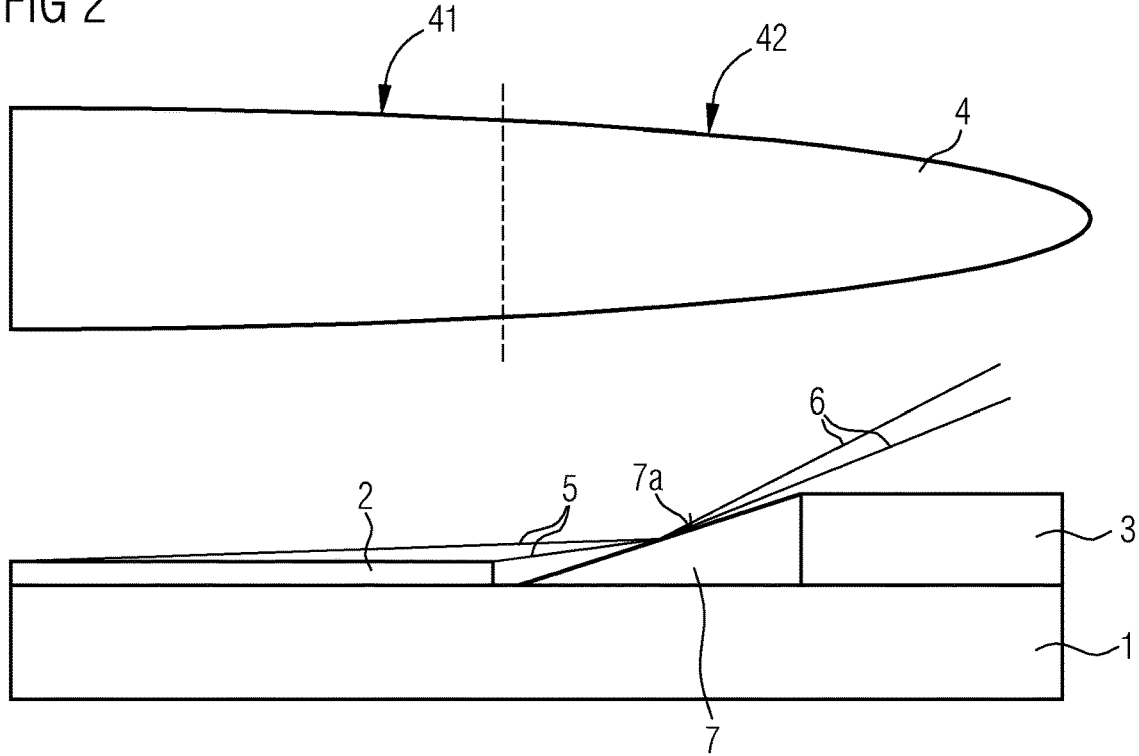

In the exemplary embodiment of FIG. 2, the cover 3 comprises an ordinary shape. An optical body 7, which guides light 5 emitted from the light source 2 away from the central area 41 of the optical element 4 is arranged between the light source 2 and the cover 3. Thus, a provision is made to prevent impingement of reflected light 6 in the central region of the optical element 4 or to guide the reflected light away from the acceptance angle of the subsequent optical system. For example, the acceptance angle is 45°. Thereby, the optical body 7 completely surrounds the light source in lateral directions. In cross-section, the optical body 7 is designed wedge-shaped. It comprises a reflective oblique outer surface 7a facing away from the connection board 1, the oblique outer surface guiding reflected light 6 away from the central area 41.

Alternatively, the optical body 7 may be a light guide which guides impinging light 5 by reflection past the optical element 4 out of the light-emitting component. In this way, too, it is ensured that no light is reflected into the central region 41 or that no reflected light falls within the acceptance angle of the optical system.

Figure 3:
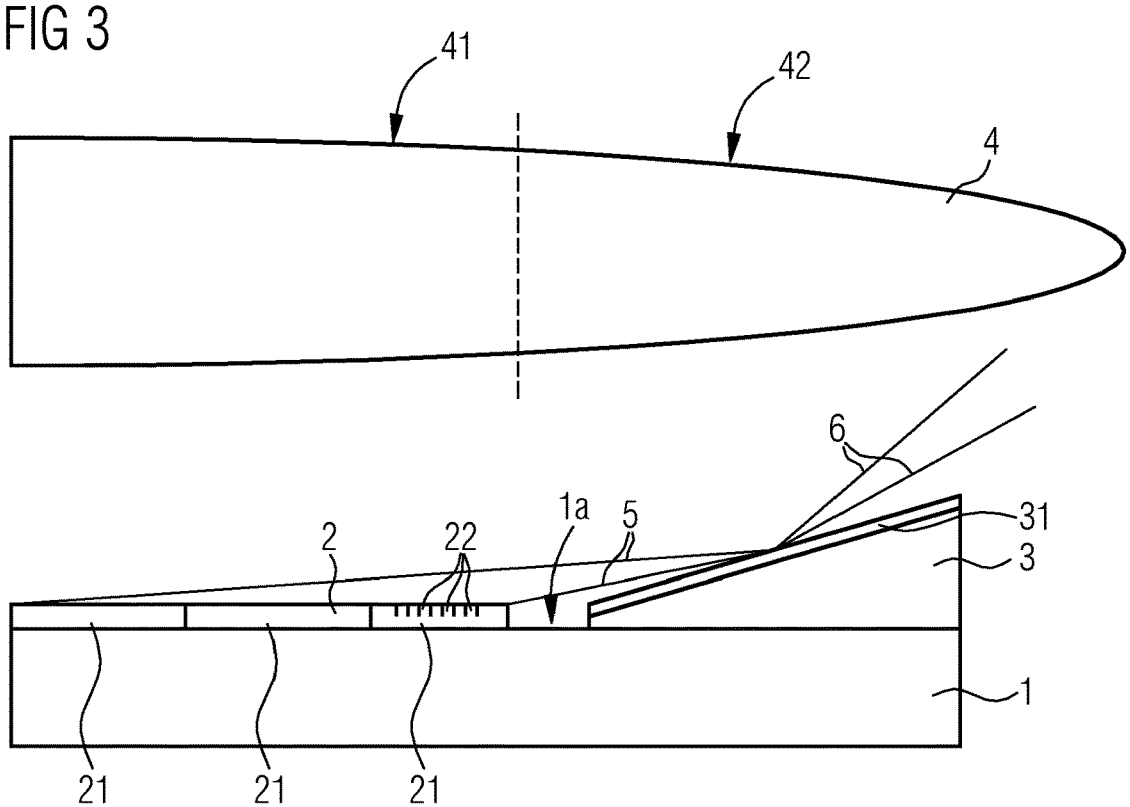

In connection with the schematic sectional view of FIG. 3, a further exemplary embodiment of a light-emitting component described herein is described. In this exemplary embodiment, in contrast to the exemplary embodiment of FIG. 1, a light-reflecting layer 31 is applied to the cover 3 on its outer surface 3a. The light-reflecting layer 31 is arranged to reflect impinging light 6 in a directional manner, so that in this way, a provision is made to prevent impingement of reflected light 6 in the central region 41 of the optical element 4 or a provision is made that no reflected light falls within the acceptance angle of the subsequent optical system.

The use of a light-reflecting layer 31 has the advantage that the surface of the cover 3 does not have to be reflective, but the reflectivity can be generated by the reflecting layer 31. The surface of the cover 3 therefore, for example, does not have to be made particularly smooth in order to achieve the desired reflection. A reflection on a rough surface mapped into the far field may be less problematic, because the rough surface makes the reflection appear washed out.

Figure 4:
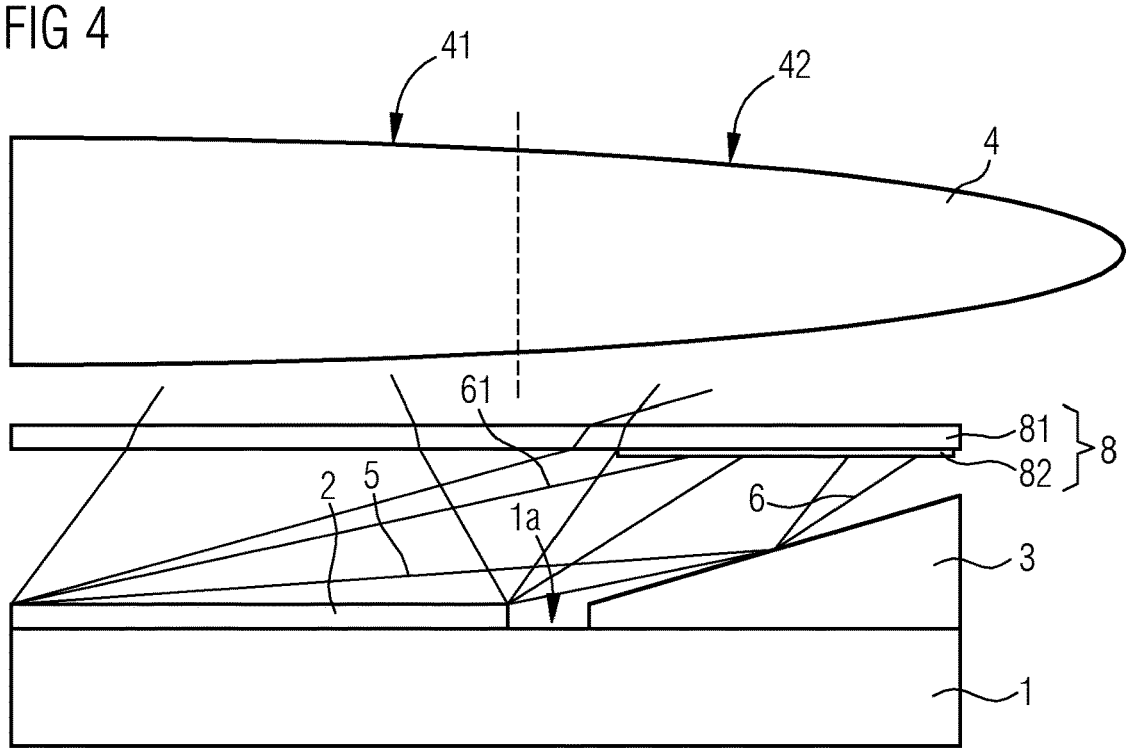

In connection with FIG. 4, a further exemplary embodiment of a light-emitting component described herein is explained in more detail by means of a schematic sectional view. In contrast to the exemplary embodiment of FIG. 1, the component comprises an aperture 8, which comprises a main body 81 and an opaque layer 82. The aperture 8 is arranged between the light source 2 and the optical element 4 and covers the light source 2 and the cover 3. The opaque layer thereby covers the main body 81 in the region above the cover and the main body 81 is free of the opaque layer in the region above the light source. The cover 3 may, for example, be designed reflective, as described in connection with FIG. 1. Furthermore, it is possible that a reflecting layer 31, as described in connection with FIG. 3, is applied onto the cover. Finally, as cover, a cover of conventional shape as described in connection with FIG. 2 may be used. Light 6 reflected from the cover is absorbed or reflected by the opaque layer 82, so that a provision is made to prevent impingement of reflected light 6 and/or of a portion of the non-reflected light 61 in the central region 41 of the optical element 4.

Figure 5:
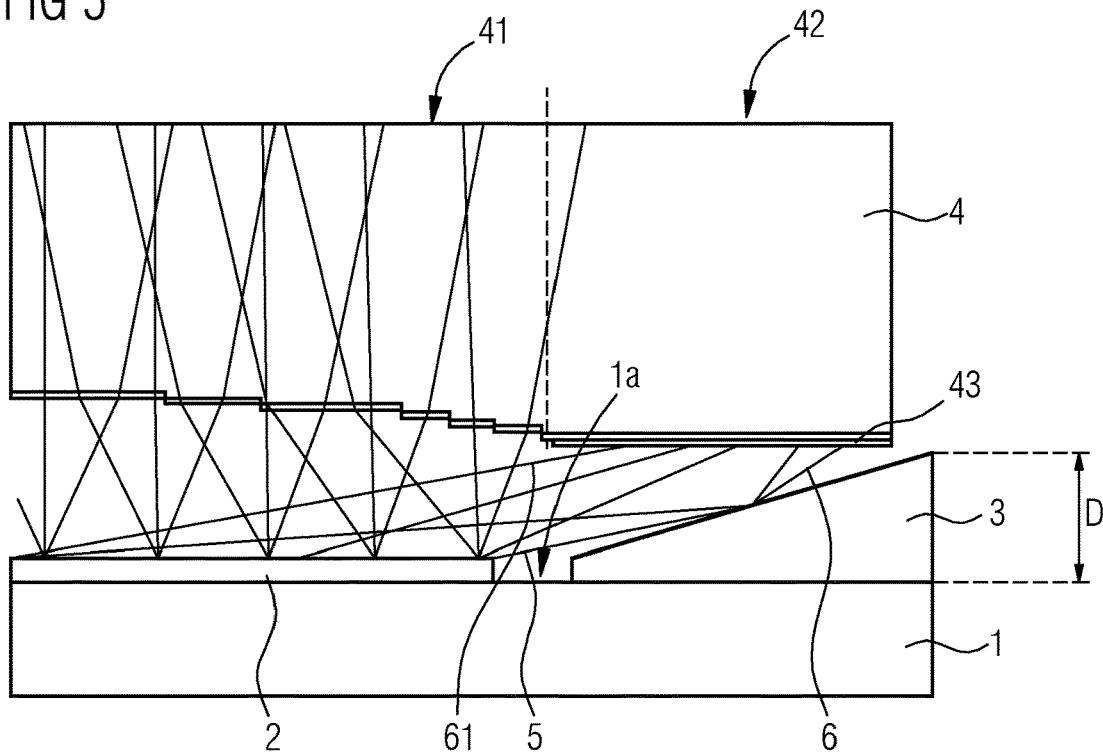

In connection with FIG. 5, a further exemplary embodiment of a light-emitting component described herein is explained in more detail by means of a schematic sectional view. In this exemplary embodiment, the optical element 4 comprises, in the edge region 42 which laterally surrounds the central region 41, on the side of the optical element 4 facing the connection board 1, a light-absorbing layer 43 which is arranged to absorb reflected light 6 and/or a portion of the non-reflected light 61. In this way, a provision is made to prevent impingement of reflected light 6 and/or of a portion of the non-reflected light 61 in the central region 41 of the optical element. In the region of the optical element to which the light-absorbing layer 43 is applied, that is, on the underside of the edge region 42 facing the connection board 1, the optical element 4 can in particular run parallel to the mounting surface 11 of the connection board 1.

Figure 6:
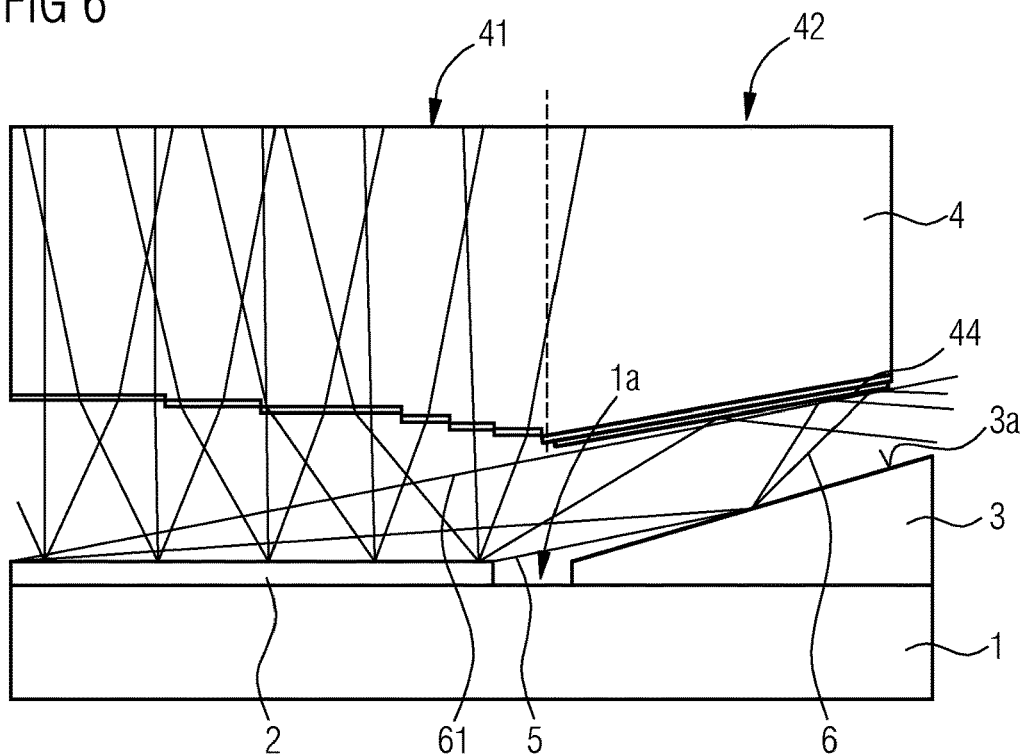

In connection with FIG. 6, a further exemplary embodiment of a light-emitting component described herein is explained in more detail by means of a schematic sectional view. In this exemplary embodiment, the optical element 4 comprises, in the edge region 42 on the side of the optical element 4 facing the connection board 1, a light-reflecting layer 44 which is arranged to reflect reflected light 6 and/or a portion of the non-reflected light 61. Thus, a provision is made to prevent impingement of reflected light 6 in the central region of the optical element 4. On the underside of the edge region 42 of the optical element 4 facing the connection board 1, the outer surface of the optical element can run obliquely to the mounting surface 11 of the connection board 1. For example, this outer surface runs parallel to the outer surface 3a of the cover 3 at least in places. In this way, light reflected at the cover 3 can be guided out of the light-emitting component by directional reflection at the reflective layer 44 by means of particularly few reflections.

In the light-emitting components described herein, it is particularly possible to combine the provisions described herein for preventing impingement of light on the central region 41 of the optical element 4. For example, the use of the aperture 8 as shown in FIG. 4 can be combined with the special shaping of the cover 3 as shown in connection with FIG. 1.

The invention is not limited to the embodiments by the description based thereon. Rather, the invention comprises any new feature as well as any combination of features, which in particular includes any combination of features in the patent claims, even if this feature or this combination itself is not explicitly stated in the patent claims or embodiments.

LIST OF REFERENCE SIGNS 1 connection board
1a mounting side of the connection board
11 mounting surface of the connection board
2 light source
21 light-emitting diode chip
22 pixel
3 cover
31 light-reflecting layer of the cover
3a Au 4 optical element
41 central region of the optical element
42 edge region of optical element
43 light-absorbing layer of the optical element
44 light-reflecting layer of the optical element
5 light emitted by the light source
6 reflected light
61 non-reflected light
7 optical body
7a outer surface of the optical body
8 aperture
81 main body
82 opaque layer of the aperture

The invention claimed is:

1. A light-emitting component comprising
a connection board with a mounting side,
a light source which is fastened and electrically connected to the connection board on the mounting side,
a cover which covers the connection board in places on its mounting side and laterally surrounds the light source,
an optical element having a central region which is arranged downstream of the light source on the mounting side of the connection board, wherein
a provision is made to prevent impingement of reflected light in the central region of the optical element, wherein the provision is made by at least one of the following:
a shape, optical properties and/or a material of the cover,
an optical body arranged between the light source and the cover, the optical body guiding light emitted by the light source away from the central region of the optical element,
the optical element comprising, in an edge region that laterally surrounds the central region, a light-absorbing layer or a light-reflecting layer on the side of the optical element facing the connection board,
an aperture, covering the light source and the cover, and being arranged between the light source and the optical element.

2. The light-emitting component according to claim 1, wherein the cover is configured to guide light emitted by the light source away from the central region of the optical element.

3. The light-emitting component according to claim 1, wherein the cover comprises a thickness which increases in direction away from the light source.

4. The light-emitting component according to claim 1, wherein the cover comprises a reflective outer surface on its side facing away from the connection board.

5. The light-emitting component according to claim 4, wherein the outer surface runs obliquely to a mounting surface on the mounting side of the connection board.

6. The light-emitting component according to claim 1, wherein the cover comprises a light-reflecting layer on its outer surface.

7. The light-emitting component according to claim 1, wherein the aperture comprises a main body and an opaque layer, wherein the opaque layer covers the main body in a region above the cover and the main body is free of the opaque layer in a region above the light source.

8. The light-emitting component according to claim 1, wherein the cover projects beyond the light source on the mounting side.

9. The light-emitting component according to claim 1, wherein the light source comprises two or more pixelated light-emitting diode chips.

10. A light-emitting component comprising
a connection board with a mounting side,
a light source which is fastened and electrically connected to the connection board on the mounting side,
a cover which covers the connection board in places on its mounting side and laterally surrounds the light source,
an optical element having a central region which is arranged downstream of the light source on the mounting side of the connection board, wherein
a provision is made to prevent impingement of reflected light, formed by impingement on the cover, in the central region of the optical element,
wherein the provision is made by an aperture,
the aperture is arranged between the light source and the optical element,
the aperture covers the light source and the cover,
the aperture comprises an optical opening directly below the central region of the optical element, and
light from the light source can pass through the optical opening.

11. The light-emitting component according to claim 10, wherein the aperture comprises an opaque region immediately above the cover.

* * * * *